(12) United States Patent
Shieh et al.

(10) Patent No.: US 6,358,834 B1
(45) Date of Patent: Mar. 19, 2002

(54) METHOD OF FORMING BUMPS ON WAFERS OR SUBSTRATES

(75) Inventors: Wen Lo Shieh; Fu Yu Huang; Yung-Cheng Chuang; Hsuan Jui Chang; Hui-Pin Chen; Ning Huang; Feng-Chang Tu; Chung-Ming Chang; Hua Wen Chiang; Chia-Chieh Hu, all of Taipei (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 0 days.

(21) Appl. No.: 09/688,123

(22) Filed: Oct. 16, 2000

(51) Int. Cl.[7] ............................................. H01L 23/488
(52) U.S. Cl. .................... 438/614; 438/615; 427/96; 427/123
(58) Field of Search ................... 438/614, 615, 438/FOR 343; 29/25.01, DIG. 1; 427/96, 123

(56) References Cited

U.S. PATENT DOCUMENTS 5,693,565 A * 12/1997 Camilletti et al.
5,946,590 A *  8/1999 Satoh
6,181,569 B1 *  1/2001 Chakravorty

* cited by examiner

Primary Examiner—George Fourson
Assistant Examiner—Joannie Adelle Garcia
(74) Attorney, Agent, or Firm—A & J

(57) ABSTRACT

A method of forming metal bumps on a wafer includes the steps of adhering a heat-resistant and steady synthetic tape on the top of the wafer, punching holes through the synthetic tape to form a blind hole on the synthetic tape above the under-bump-metallurgy layer (UBM), filling solder paste into the blind hole by a pusher, melting and then cooling the solder paste into a solder block removing the synthetic tape to expose the solder block, and melting the solder block to form a ball-shaped solder bump.

2 Claims, 3 Drawing Sheets

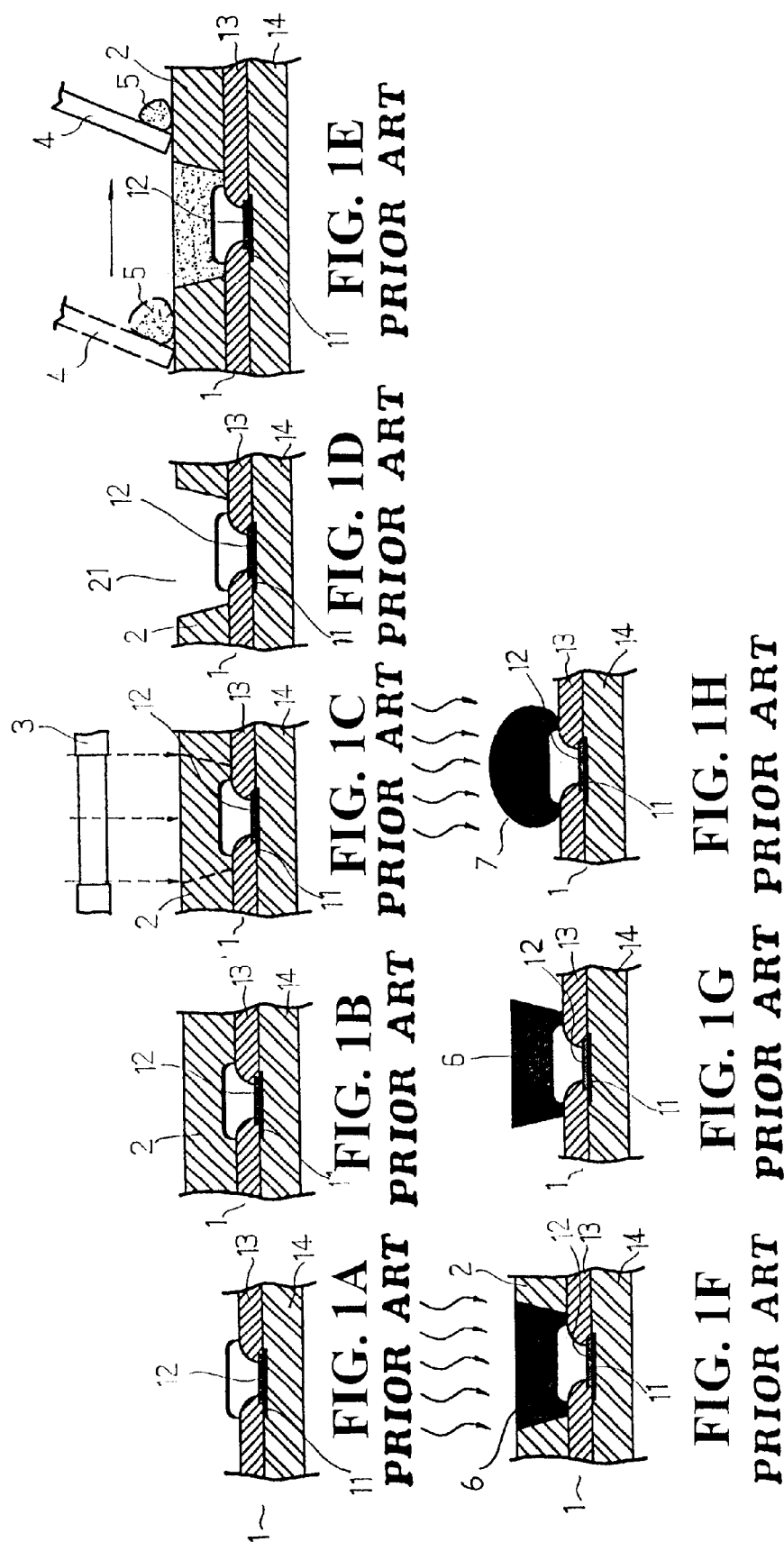

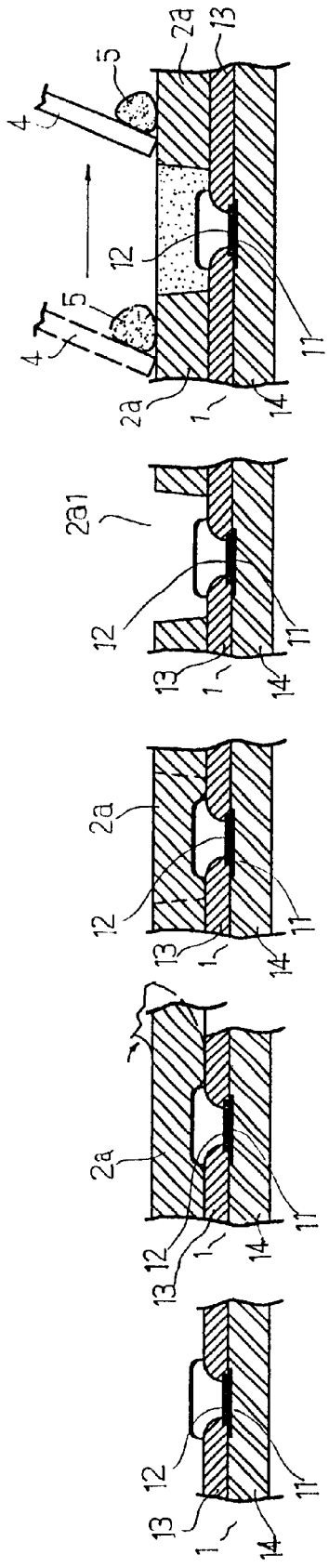
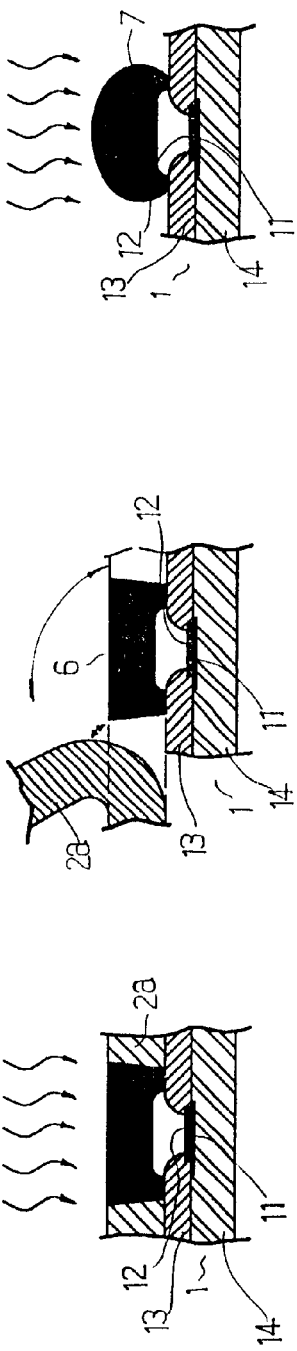

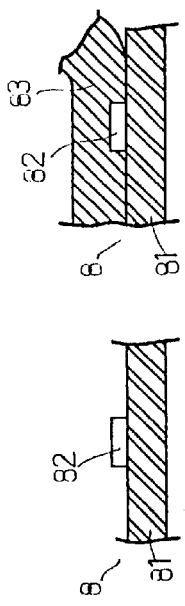
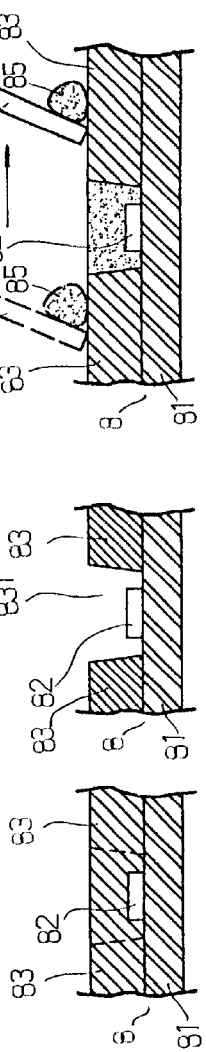
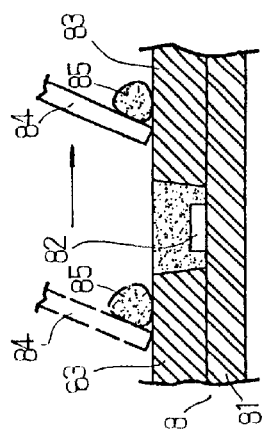
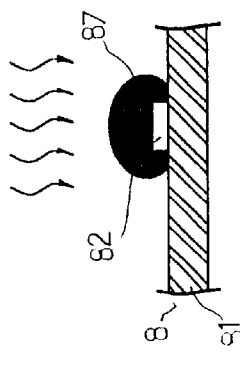
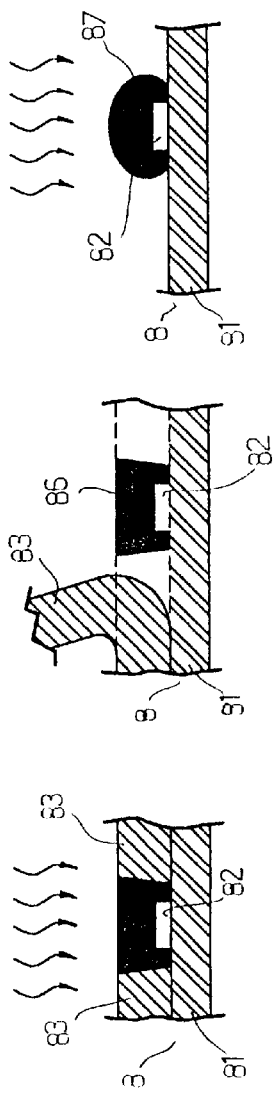
FIG. 3A  FIG. 3B  FIG. 3C  FIG. 3D  FIG. 3E
FIG. 3F  FIG. 3G  FIG. 3H

METHOD OF FORMING BUMPS ON WAFERS OR SUBSTRATES

BACKGROUND OF THE INVENTION

1. Field of the Invention

This invention is related to a method of forming bumps on wafers or substrates and in particular to one which is simple in operation and can be carried out at low cost.

2. Description of the Prior Art

Ball-Grid-Array (BGA), Chip-Size/Scale-Package (CSP) and Flip-Chip are the most popular of the newly developed packaging techniques and these techniques mostly rely on the flip chip mounting technology process. The broad meaning of flip chip mounting technology process is that the chip is first turned over and then affixed with its upper surface to a substrate via metal conductors. Generally, the metal conductors are referred to as metal bumps which are widely used in products in mass production because they are more reliable in manufacture than other means. The low cost bumping technology for forming the metal bump utilizes the electroless Ni/Au process to form a under-bump-metallurgy (UBM) layer first and then implants metal bumps thereon.

Referring to FIGS. 1a~1h, a UBM layer 12 is first formed on the electrode pad on the upper side of the wafer 1 by the electroless Ni/Au method. Then, a layer of photo-resistant agent 2 is coated on the top of the wafer 1 and the heated. Thereafter, a mask 3 is arranged above the wafer 1 and then exposed to light to form a blind hole 21 above the UBM layer 12. Then, solder paste 5 is filled into the blind hole 21 by a pusher 4 and heated to melt and cool into a solder block 6. Then, the photo-resistant agent 2 is removed by a chemical agent and cleaned to leave a protruded solder block 6. Finally, the protruded solder block 6 is further heated to form a ball-shaped solder bump 7.

However, the photo-resistant agent, the exposure and the removal of the photo-resistant agent cause a lot of drawbacks in such a method. Firstly, it is necessary to allow a certain period of time for the drying of the photo-resistant agent. In addition, a mask is required for the exposure procedure, thereby increasing cost. Furthermore, the photo-resistant agent must be removed by a chemical agent, which makes the method more complicated, requires a longer time to complete the method, and therefore increases the manufacturing costs. Thus, it is an object of the present invention to provide a method of forming bumps on wafers or substrates which can obviate and mitigate the above-mentioned drawbacks.

SUMMARY OF THE INVENTION

This invention is related to a method of forming bumps on wafers or substrates and in particular to one which is simple in operation and can be carried out at low cost.

It is the primary object of the present invention to provide a method of forming bumps on wafers or substrates which utilizes the step of adhering synthetic tape on the wafer instead of the conventional method of filling a photo-resistant agent on the wafer, thereby eliminating the time required for the drying of the photo-resistant agent It is another object of the present invention to provide a method of forming bumps on wafers or substrates which utilizes laser to punch holes on the synthetic tape to form a blind hole and then removes the synthetic tape after the solder paste is melted and cooled into a solder block, instead of using a mask and processing the photo-resistant agent with exposure treatment to form a blind hole on the wafer, thereby eliminating the cost of the mask and largely reducing the time required for this procedure.

According to a preferred embodiment of the present invention, the method of forming bumps on wafers or substrates includes the steps of adhering a heat-resistant and steady synthetic tape on the top of the wafer, punching holes through the synthetic tape to form a blind hole on the synthetic tape above the under-bump-metallurgy layer (UBM), filing solder paste into the blind hole by a pusher, melting and then cooling the solder paste into a solder block, removing the synthetic tape to expose the solder block, and melting the solder block to form a ball-shaped solder bump.

The foregoing objects and summary provide only a brief introduction to the present invention. To filly appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts. Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIGS. 1a, 1b, 1c, 1d, 1e, 1f, 1g and 1h illustrate a conventional manufacturing process of forming metal bumps on wafers;

FIGS. 2a, 2b, 2c, 2d, 2e, 2f, 2g and 2h illustrate a method of forming metal bumps on a wafer according to the present invention; and FIGS. 3a, 3b, 3c, 3d, 3e, 3f, 3g and 3h illustrate a method of forming metal bumps on a substrate according to the present invention.

DETAILED DESCRIPTION OF THE PREFERRED EMBODIMENT

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

The method of forming metal bumps on wafers or substrates according to the present invention generally comprises the steps of adhering a synthetic tape to the top surface of a wafer, forming a blind hole on the synthetic tape by laser, filing solder paste into the blind hole by a pusher, melting and cooling the solder paste into a solder block, removing the synthetic tape, and melting the solder block to form a ball-shaped solder bump.

Referring to FIGS. 2a~2h, the method of forming metal bumps on wafers or substrates according to the present invention will be described in detail as follows:

a. forming an under-bump-metallurgy layer (UBM) 12 on an electrode pad 11 on the top of a wafer 1 by electroless Ni/Au process (see FIG. 2a);

b. adhering a heat-resistant and steady synthetic tape 2a on the top of the wafer 1 (see FIG. 2b);

c. punching holes through the synthetic tape 2a above the under-bump-metallurgy layer 12 by laser (see FIG. 2c);

d. forming a blind hole 2a1 on the synthetic tape 2a above the under-bump-metallurgy layer 12 (see FIG. 2d);

e. fillig solder paste 5 into the blind hole 2a1 by a pusher 4 (see FIG. 2e);

f. melting and then cooling the solder paste 5 into a solder block 6 (see FIG. 2f);

g. removing the synthetic tape 2a to expose the solder block 6 (see FIG. 2g); and h. melting and then cooling the solder block 6 to form a ball-shaped solder bump 7.

However, it should be noted that the formation of UBM layer 12 is not limited to the electroless Ni/Au process, and can be obtained by any other known means.

Consequently, the present invention utilizes the step of adhering the synthetic tape instead of filling photo-resistant agent in the conventional method thereby eliminating the time required for the drying of the photo-resistant resistant agent. In addition, the present invention utilizes a laser to punch holes on the synthetic tape to form a blind hole and then removes the synthetic tape after the solder paste is melted and cooled into a solder block, instead of using a mask and processing the photo-resistant agent with exposure treatment to form a blind hole on the wafer, thereby eliminating the cost of the mask and largely reducing the time required for this procedure.

Furthermore, the present invention can be applied to form metal bumps on a substrate. As shown in FIGS. 3a~3h, the method of forming metal bumps on a substrate comprises the steps of:

a. forming copper circuit of a substrate 8 (see FIG. 3a);

b. adhering a heat-resistant and steady synthetic tape 83 on the top of the substrate 8 (see FIG. 3b);

c. punching holes through the synthetic tape 83 above the copper circuit 82 by laser (see FIG. 3c);

d. forming a blind hole 831 on the synthetic tape 83 above the copper circuit 82 (see FIG. 3d);

e. filling solder paste 85 into the blind hole 831 by a pusher 84 (see FIG. 3e);

f melting and then cooling the solder paste 85 into a solder block 86 (see FIG. 3f);

g. removing the synthetic tape 83 to expose the solder block 86 (see FIG. 3g); and h. melting and then cooling the solder block 86 to form a ball-shaped solder bump 87.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A method of forming metal bumps on a wafer comprising the steps of:

a. forming an under-bump-metallurgy layer on an electrode pad on the top of a wafer;

b. adhering a synthetic tape on said top of said wafer;

c. punching holes through said synthetic tape above said under-bump-metallurgy layer by laser;

d. forming a blind hole on said synthetic tape above said under-bump-metallurgy layer;

e. filling solder paste into said blind hole by a pusher;

f. melting and then cooling said solder paste into a solder block;

g. removing said synthetic tape to expose said solder block; and h. melting said solder block to form a ball-shaped solder bump.

2. A method of forming metal bumps on a substrate comprising the steps of:

a. forming the copper circuit of a substrate;

b. adhering a synthetic tape on a top of said substrate;

c. punching holes through said synthetic tape above said copper circuit by laser;

d. forming a blind hole on said synthetic tape above said copper circuit;

e. filling solder paste into said blind hole by a pusher;

f. melting and then cooling said solder paste into a solder block;

g. removing said synthetic tape to expose said solder block; and h. melting and then cooling said solder block to form a ball-shaped solder bump.

* * * * *